US012113017B2

(12) United States Patent
Williams et al.

(10) Patent No.: US 12,113,017 B2
(45) Date of Patent: Oct. 8, 2024

(54) PACKED TERMINAL TRANSISTORS

(71) Applicant: QUALCOMM Incorporated, San Diego, CA (US)

(72) Inventors: Thomas Hua-Min Williams, Irvine, CA (US); Khaja Ahmad Shaik, Douglas (IE); Jeongah Park, San Diego, CA (US); Rinoj Thomas, Cork (IE); Harini Siddaiah, Mysore (IN); Raj Kumar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 424 days.

(21) Appl. No.: 17/651,561

(22) Filed: Feb. 17, 2022

(65) Prior Publication Data
US 2023/0260903 A1    Aug. 17, 2023

(51) Int. Cl.
*H01L 23/528* (2006.01)
*H01L 23/522* (2006.01)
*H01L 29/78* (2006.01)

(52) U.S. Cl.
CPC ........ *H01L 23/528* (2013.01); *H01L 23/5226* (2013.01); *H01L 29/785* (2013.01)

(58) Field of Classification Search
CPC ............... H01L 29/785; H01L 27/0886; H01L 29/41791; H01L 21/823431; H01L 23/528; H01L 23/52; H01L 23/522; H01L 23/5226; H01L 21/823475; H01L 27/0207
See application file for complete search history.

(56) References Cited

U.S. PATENT DOCUMENTS

| 2015/0108538 | A1* | 4/2015 | Chen ...................... H01L 21/22 |
| | | | 257/132 |
| 2016/0071848 | A1 | 3/2016 | Sengupta et al. |
| 2018/0090495 | A1 | 3/2018 | Lee et al. |
| 2020/0097632 | A1* | 3/2020 | Lin ..................... H01L 27/0886 |
| 2020/0105887 | A1 | 4/2020 | Kundu et al. |
| 2021/0217861 | A1 | 7/2021 | Song et al. |
| 2021/0336005 | A1 | 10/2021 | Shank et al. |

OTHER PUBLICATIONS

International Search Report and Written Opinion—PCT/US2023/061938—ISA/EPO—Jun. 2, 2023.

* cited by examiner

*Primary Examiner* — Wasiul Haider
(74) *Attorney, Agent, or Firm* — Loza & Loza, LLP

(57) ABSTRACT

A die includes fins extending in a first direction, a gate formed over the fins, the gate extending in a second direction that is perpendicular to the first direction, a first source/drain contact layer formed over the fins and extending in the second direction, and a second source/drain contact layer formed over the fins and extending in the second direction, wherein the first source/drain contact layer and the second source/drain contact layer are on opposite sides of the gate. The die also includes a first source/drain metal layer electrically coupled to the first source/drain contact layer, and a second source/drain metal layer electrically coupled to the second source/drain contact layer, wherein the first source/drain metal layer and the second source/drain metal layer do not overlap one or more of the fins.

27 Claims, 9 Drawing Sheets

PACKED TERMINAL TRANSISTORS

BACKGROUND

Field

Aspects of the present disclosure relate generally to transistors, and more particularly, to layouts for transistors.

Background

A semiconductor die may include a large number of transistors. To fit a larger number of transistors on the die, it is desirable to reduce the area of each transistor on the die. One factor affecting the area of a transistor on the die is the layout of the transistor. Layouts often need to make a tradeoff between saving area versus reducing parasitic resistance and/or reducing parasitic capacitance. This makes it challenging to generate layouts that reduce the area of a transistor while not incurring a large increase in parasitic resistance and/or parasitic capacitance.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a die. The die includes fins extending in a first direction, a gate formed over the fins, the gate extending in a second direction that is perpendicular to the first direction, a first source/drain contact layer formed over the fins and extending in the second direction, and a second source/drain contact layer formed over the fins and extending in the second direction, wherein the first source/drain contact layer and the second source/drain contact layer are on opposite sides of the gate. The die also includes a first source/drain metal layer electrically coupled to the first source/drain contact layer, and a second source/drain metal layer electrically coupled to the second source/drain contact layer, wherein the first source/drain metal layer and the second source/drain metal layer do not overlap one or more of the fins.

A second aspect relates to a system. The system includes a switch. The switch includes fins extending in a first direction, a gate formed over the fins, the gate extending in a second direction that is perpendicular to the first direction, a first source/drain contact layer formed over the fins and extending in the second direction, a second source/drain contact layer formed over the fins and extending in the second direction, wherein the first source/drain contact layer and the second source/drain contact layer are on opposite sides of the gate, a first source/drain metal layer electrically coupled to the first source/drain contact layer, a second source/drain metal layer electrically coupled to the second source/drain contact layer, wherein the first source/drain metal layer and the second source/drain metal layer do not overlap one or more of the fins, and a gate metal layer electrically coupled to the gate. The system also includes a power switch controller coupled to the gate metal layer, a power distribution network coupled to a first one of the first source/drain metal layer and the second source/drain metal layer, and a circuit coupled to a second one of the first source/drain metal layer and the second source/drain metal layer.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

FIGS. 1A to 1D show top views of an exemplary transistor 105 formed on the substrate of a semiconductor die according to certain aspects of the present disclosure. Although only one transistor 105 is shown in FIGS. 1A to 1D, it is to be appreciated that a die typically includes millions to billions of transistors. In the example shown in FIGS. 1A to 1D, the transistor 105 is a Fin Field Effect Transistor (FinFET). However, it is to be appreciated that exemplary layout techniques disclosed herein may also be applied to planar transistor technologies.

Figure 1A:
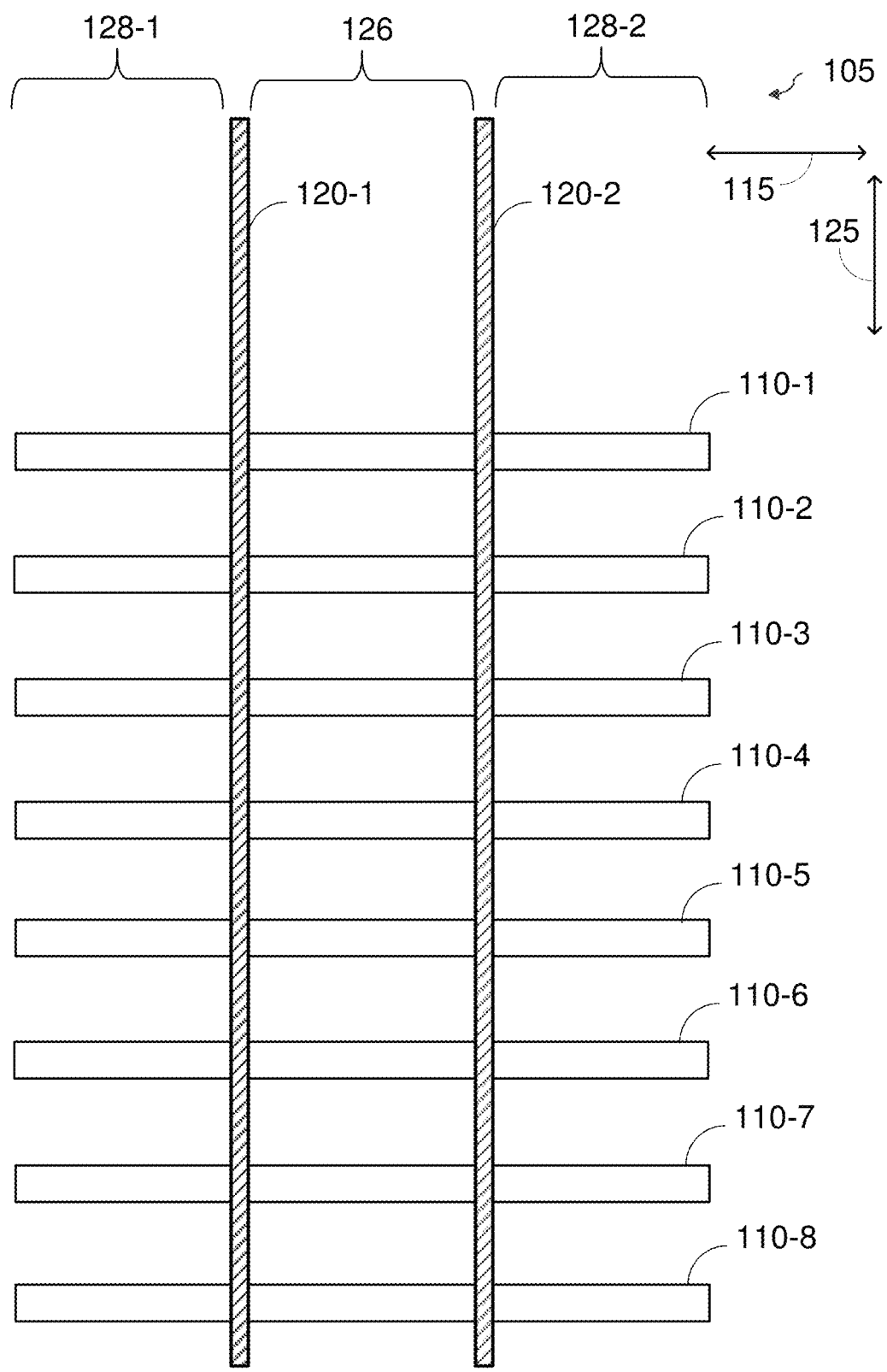
FIG. 1A shows an exemplary layout of gates and fins according to certain aspects of the present disclosure.

As shown in FIG. 1A, the transistor 105 includes fins 110-1 to 110-8 running parallel to each other, and extending in a first direction 115. The first direction 115 is a lateral direction in that the first direction 115 runs horizontally with respect to the substrate of the die. The fins 110-1 to 110-8 are evenly spaced apart in the example shown in FIG. 1A. The fins 110-1 to 110-8 may be made of silicon, silicon germanium, silicon carbon, or any combination thereof. Although eight fins 110-1 to 110-8 are shown in the example in FIG. 1A, it is to be understood that the transistor 105 may include any number of fins.

The transistor 105 also includes a first gate 120-1 and a second gate 120-2 formed over the fins 110-1 to 110-8 and running perpendicular to the fins 110-1 to 110-8, as shown in FIG. 1A. Each of the first gate 120-1 and the second gate 120-2 extends in a second direction 125, in which the second direction 125 is perpendicular to the first direction 115. The second direction 125 is a lateral direction in that the second direction 125 runs horizontally with respect to the substrate of the die. Although two gates 120-1 and 120-2 are shown in the example in FIG. 1, it is to be understood that the transistor 105 may include a different number of gates.

The portions of the fins 110-1 to 110-8 under the gates 120-1 and 120-2 serve as the channel of the transistor 105 in which the voltage applied to the gates 120-1 and 120-2 controls the conductivity of the channel. The portion 126 of the fins 110-1 to 110-8 located between the gates 120-1 and 120-2 may serve as the source of the transistor 105, and the portions 128-1 and 128-2 of the fins 110-1 to 110-8 located on the opposite sides of the gates 120-1 and 120-2 may serve as the drain of the transistor 105. Alternatively, the portion 126 of the fins 110-1 to 110-8 located between the gates 120-1 and 120-2 may serve as the drain of the transistor 105, and the portions 128-1 and 128-2 of the fins 110-1 to 110-8 located on the opposite sides of the gates 120-1 and 120-2 may serve as the source of the transistor 105.

The transistor 105 may also include a thin dielectric layer (not shown) interposed between the fins 110-1 to 110-8 and the gates 120-1 and 120-2. However, it is to be appreciated that the present disclosure is not limited to this example.

Figure 1B:
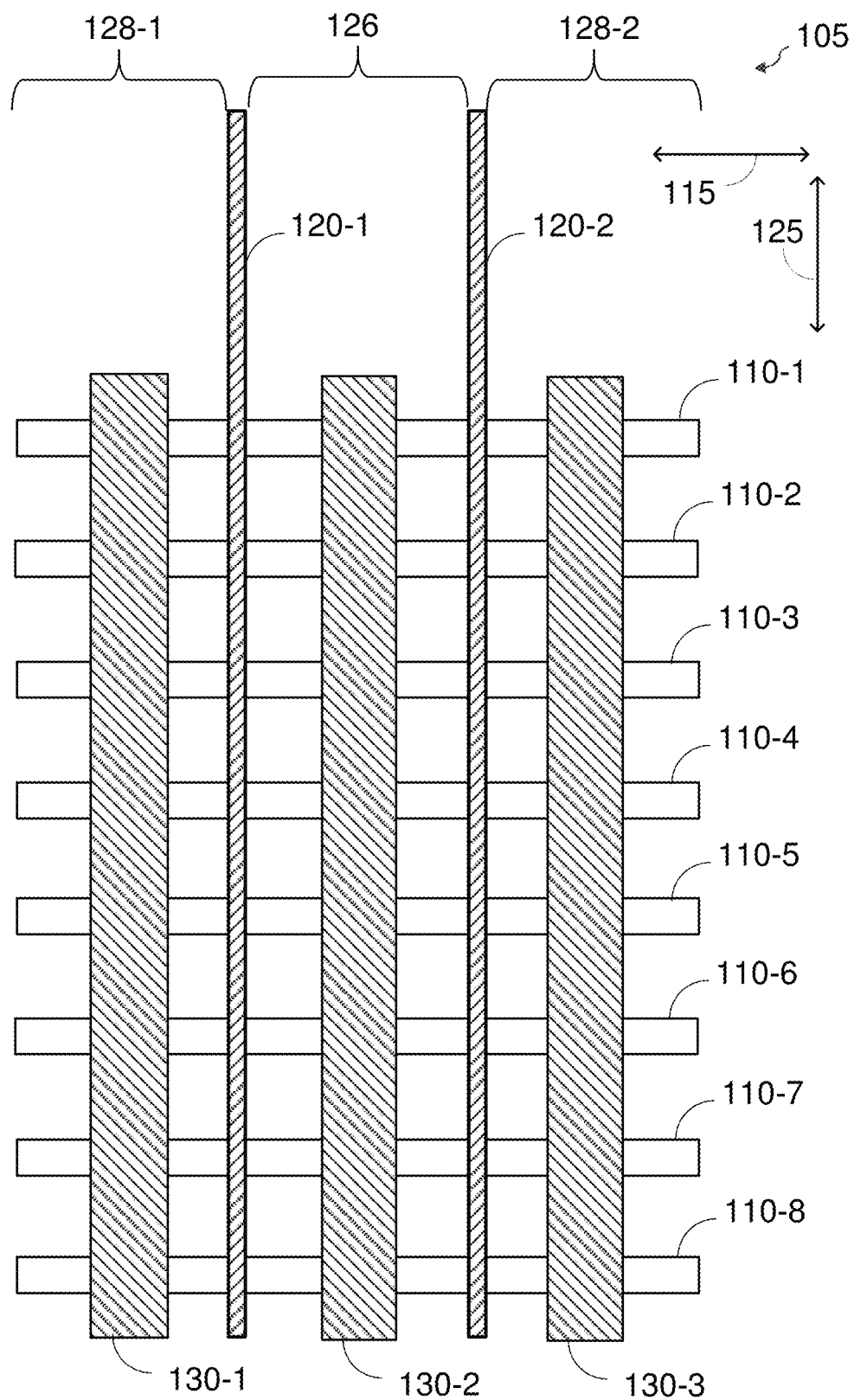
FIG. 1B shows an example of source/drain contact layers formed on the fins according to certain aspects of the present disclosure.

Referring to FIG. 1B, the transistor 105 includes a first source/drain contact layer 130-1, a second source/drain contact layer 130-2, and a third source/drain contact layer 130-3. As used herein, the term "source/drain" means source or drain. For example, the first source/drain contact layer 130-1 and the third source/drain contact layer 130-3 may provide drain contacts for the transistor 105, and the second source/drain contact layer 130-2 may provide a source contact for the transistor 105. Alternatively, the first source/drain contact layer 130-1 and the third source/drain contact layer 130-3 may provide source contacts for the transistor 105, and the second source/drain contact layer 130-2 may provide a drain contact for the transistor 105. Each of the source/drain contact layers 130-1, 130-2, and 130-3 includes one conductive material or multiple conductive materials (e.g., copper and/or another metal). For example, during fabrication, the source/drain contact layers 130-1, 130-2, and 130-3 may be formed from a common metal layer using a photolithographic process and an etching process.

The first source/drain contact layer 130-1 is formed over the fins 110-1 to 110-8 on one side of the first gate 120-1. The first source/drain contact layer 130-1 is electrically coupled to the fins 110-1 to 110-8, and extends over all of the fins 110-1 to 110-8 in the second direction 125. The second source/drain contact layer 130-2 is formed over the fins 110-1 to 110-8 on the other side of the first gate 120-1 (i.e., the first source/drain contact layer 130-1 and the second source/drain contact layer 130-2 are on opposite sides of the first gate 120-1). The second source/drain contact layer 130-2 is electrically coupled to the fins 110-1 to 110-8, and extends over all of the fins 110-1 to 110-8 in the second direction 125.

In the example shown in FIG. 1B, the second source/drain contact layer 130-2 is located between the first gate 120-1 and the second gate 120-2. The third source/drain contact layer 130-3 is formed over the fins 110-1 to 110-8 on a side of the second gate 120-2 that is opposite the side of the second gate 120-2 facing the second source/drain contact layer 130-2. In other words, the second source/drain contact layer 130-2 and the third source/drain contact layer 130-3 are on opposite sides of the second gate 120-2. The third source/drain contact layer 130-3 is electrically coupled to the fins 110-1 to 110-8, and extends over all of the fins 110-1 to 110-8 in the second direction 125. As shown in FIG. 1B, the source/drain contact layers 130-1, 130-2, and 130-3 run parallel to each other in the second direction 125. As used herein, a "source/drain contact layer" provides an electrically conductive interface to one or more fins. In certain aspects, a "source/drain contact layer" may be a middle-end-of-line (MEOL) layer that provides an electrically conductive interface between one or more fins in a front-end-of-line (FEOL) and one or more metal layers (e.g., M1 layer) in a back-end-of-line (BEOL).

Figure 1C:
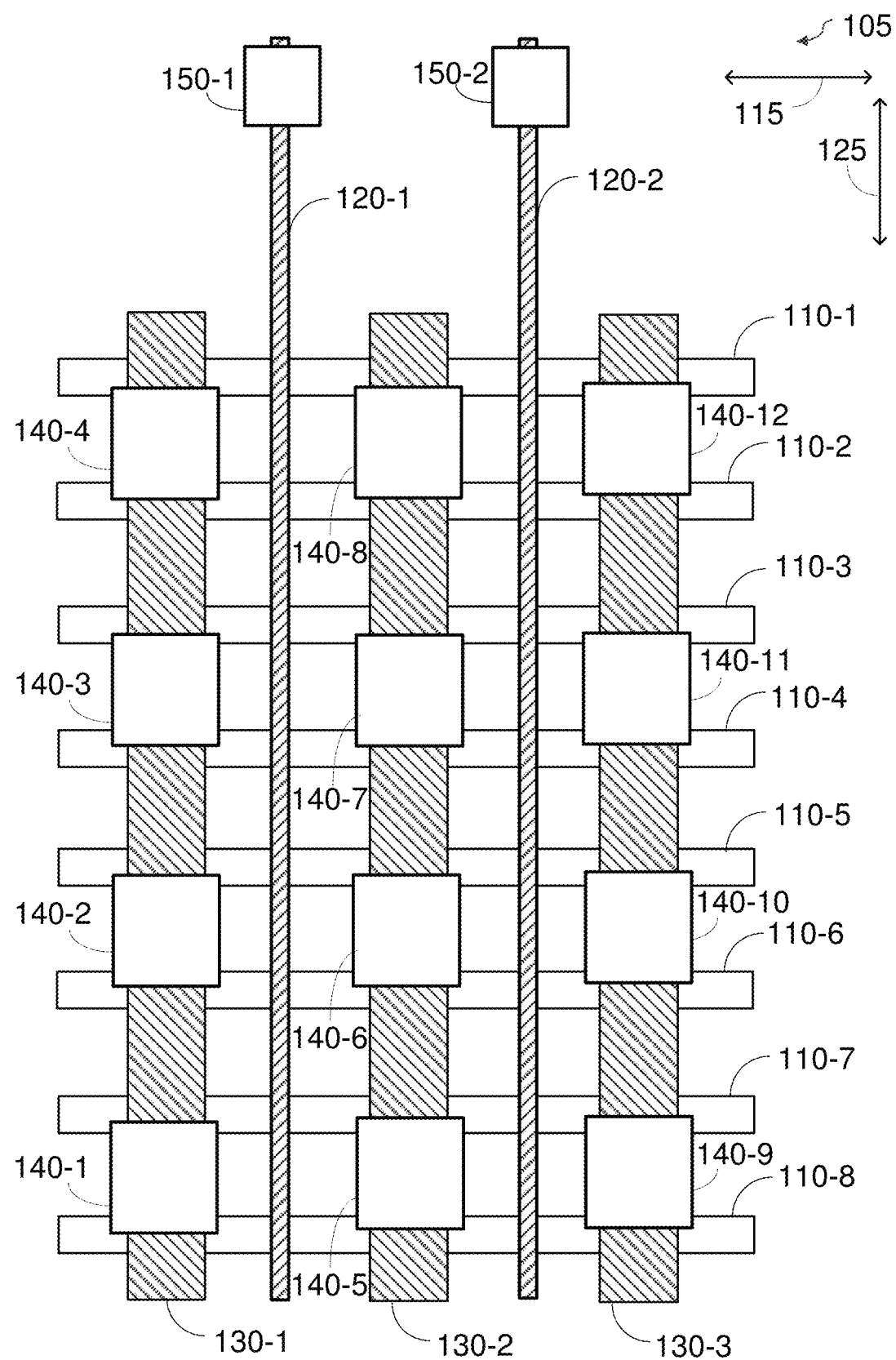
FIG. 1C shows an example of vias distributed on the source/drain contact layers according to certain aspects of the present disclosure.

Referring to FIG. 1C, the transistor 105 also includes source/drain vias 140-1 to 140-12 formed on top of the source/drain contact layers 130-1, 130-2, and 130-3. In the example shown in FIG. 1C, each of the source/drain vias 140-1 to 140-12 has a square footprint. As used herein, "a footprint" of a structure is the area of the structure seen from a top view of the die.

In this example, the source/drain vias 140-1 to 140-4 are distributed evenly on the first source/drain contact layer 130-1, the source/drain vias 140-5 to 140-8 are distributed evenly on the second source/drain contact layer 130-2, and the source/drain vias 140-9 to 140-12 are distributed evenly on the third source/drain contact layer 130-3. The source/drain vias 140-1 to 140-12 may be evenly distributed, for example, to reduce parasitic resistance between the source/drain contact layers 130-1, 130-2, and 130-3 and upper metal layers, examples of which are shown in FIG. 1D discussed below.

The transistor 105 also includes gate vias 150-1 and 150-2, in which a first one of the gate vias 150-1 is formed on top of the first gate 120-1 and a second one of the gate vias 150-2 is formed on top of the second gate 120-2. As shown in FIG. 1C, the gate vias 150-1 and 150-2 are aligned with each other in the first direction 115.

Figure 1D:
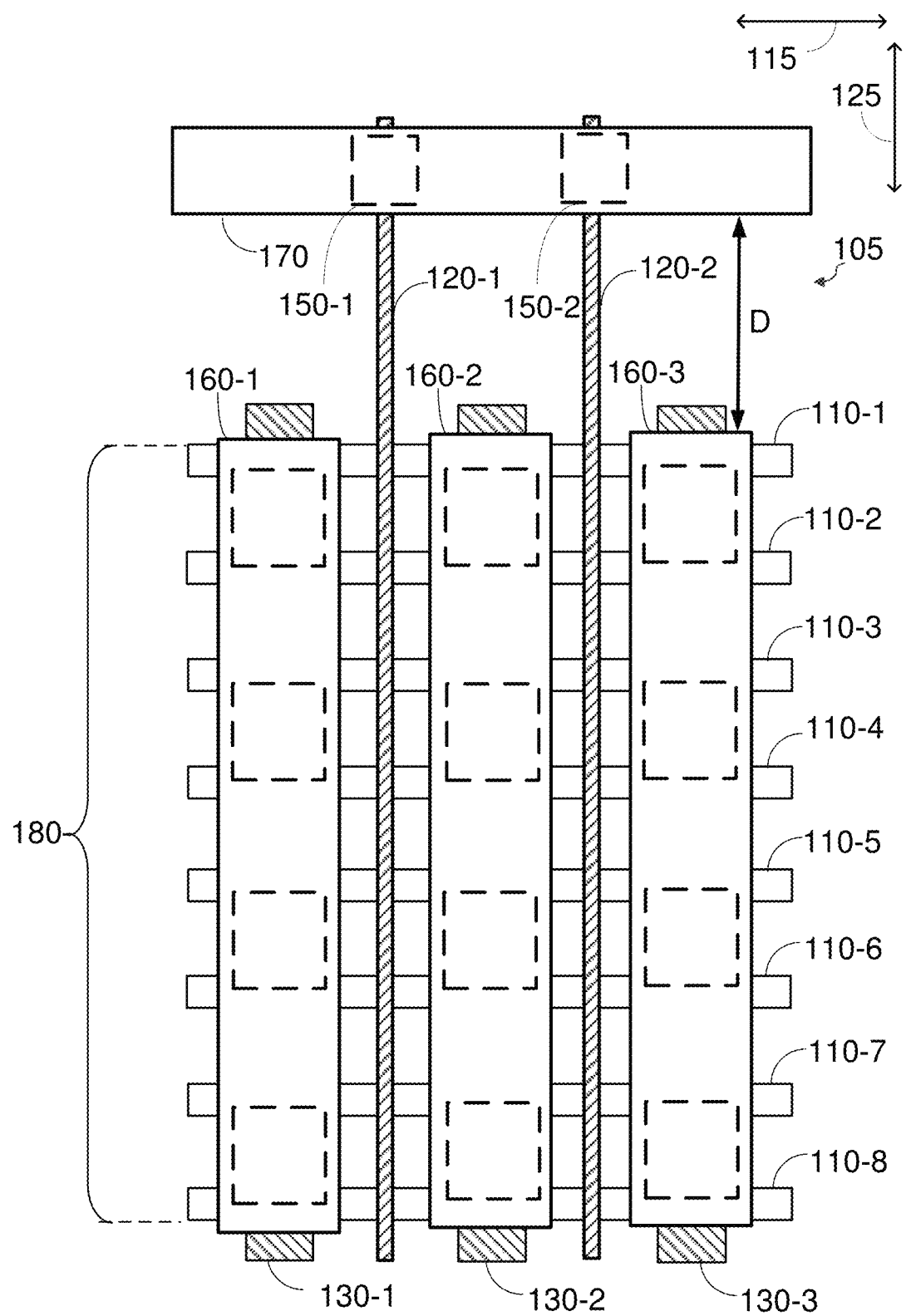
FIG. 1D shows an example of source/drain metal layers and a gate metal layer according to certain aspects of the present disclosure.

Referring to FIG. 1D, the transistor 105 also includes a first source/drain metal layer 160-1, a second source/drain metal layer 160-2, a third source/drain metal layer 160-3, and a gate metal layer 170. Each of the source/drain metal layers 160-1, 160-2, and 160-3 and the gate metal layer 170 may be formed from a first metal layer, in which the first metal layer is patterned and etched during fabrication to form the source/drain metal layers 160-1, 160-2, and 160-3 and the gate metal layer 170 shown in FIG. 1D. In certain aspects, the first metal layer is a metal-1 (M1) layer used for routing. Other metal layers on the die located above the M1 layer may be designated with higher numbers, in which a metal-2 (M2) layer is above the M1 layer, a metal-3 (M3) layer is above the M2 layer, and so forth. It is to be appreciated that the present disclosure is not limited to this example. For example, in other implementations, the gate metal layer 170 may be formed from a different metal layer than the source/drain metal layers 160-1, 160-2, and 160-3. It is also to be appreciated that, in some cases, the first metal layer may be referred to as a metal-0 (M0) layer for a convention in which the numerical designation for metal layers starts with zero.

The first source/drain metal layer 160-1 extends over the first source/drain contact layer 130-1 in the second direction 125, and overlaps all of the fins 110-1 to 110-8. The source/drain vias 140-1 to 140-4 are disposed between the first source/drain contact layer 130-1 and the first source/drain metal layer 160-1, and electrically couple the first source/drain contact layer 130-1 to the first source/drain metal layer 160-1. The source/drain vias 140-1 to 140-4 are shown with dashed lines in FIG. 1D since they are under the first source/drain metal layer 160-1.

The second source/drain metal layer 160-2 extends over the second source/drain contact layer 130-2 in the second direction 125, and overlaps all of the fins 110-1 to 110-8. The source/drain vias 140-5 to 140-8 are disposed between the second source/drain contact layer 130-2 and the second source/drain metal layer 160-2, and electrically couple the second source/drain contact layer 130-2 to the second source/drain metal layer 160-2. The source/drain vias 140-5 to 140-8 are shown with dashed lines in FIG. 1D since they are under the second source/drain metal layer 160-2.

The third source/drain metal layer 160-3 extends over the third source/drain contact layer 130-3 in the second direction 125, and overlaps all of the fins 110-1 to 110-8. The source/drain vias 140-9 to 140-12 are disposed between the third source/drain contact layer 130-3 and the third source/drain metal layer 160-3, and electrically couple the third source/drain contact layer 130-3 to the third source/drain metal layer 160-3. The source/drain vias 140-9 to 140-12 are shown with dashed lines in FIG. 1D since they are under the third source/drain metal layer 160-3.

The gate metal layer 170 extends over the first gate 120-1 and the second gate 120-2 in the first direction 115. As shown in FIG. 1D, the gate via 150-1 is disposed between the first gate 120-1 and the gate metal layer 170, and the gate via 150-2 is disposed between the second gate 120-2 and the gate metal layer 170. The gate vias 150-1 and 150-2 electrically coupled the gates 120-1 and 120-2 to the gate metal layer 170. The gate vias 150-1 and 150-2 are shown with dashed lines in FIG. 1D since they are under the gate metal layer 170.

As shown in FIG. 1D, the transistor 105 has an active region 180 including the fins 110-1 to 110-8. The active region 180 may also be referred to as a diffusion region (a legacy term carried over from planar transistor technologies) or an RX region. Note that the die may include one or more additional fins (not shown) between the active region 180 and the gate metal layer 170 that are not included in the active region 180. The one or more additional fins are not electrically coupled to the source/drain contact layers 130-1, 130-2, and 130-3, and are therefore not active. The one or more additional fins may be a byproduct of the process used to fabricate the fins 110-1 to 110-8, in which the process produces more fins on the die than needed (e.g., to maintain etch uniformity).

As shown in FIG. 1D, the gate metal layer 170 is separated from the source/drain metal layers 160-1, 160-2, and 160-3 by a minimum spacing D. The minimum spacing D may be a constraint imposed by the process technology used to fabricate the transistor 105 (e.g., to prevent the gate metal layer 170 and the source/drain metal layers 160-1, 160-2, and 160-3 from unintentionally shorting due to process variation). In this example, a design rule check (DRC) may be performed on the layout of the transistor 105 to verify that the spacing between the gate metal layer 170 and the source/drain metal layers 160-1, 160-2, and 160-3 complies with the minimum spacing D.

A challenge with the minimum spacing D between the gate metal layer 170 and the source/drain metal layers 160-1, 160-2, and 160-3 is that the minimum spacing D can result in a large space (i.e., gap) between the gate metal layer 170 and the active region 180 of the transistor 105, as shown in FIG. 1D. This is because the source/drain metal layers 160-1, 160-2, and 160-3 overlap all of the fins 110-1 to 110-8 in the active region 180. As a result, the active region 180 needs to be moved farther away from the gate metal layer 170 in order for the source/drain metal layers 160-1, 160-2, and 160 to meet the minimum spacing D from the gate metal layer 170. The large space between the gate metal layer 170 and the active region 180 of the transistor 105 increases the area of the transistor 105.

Aspects of the present disclosure provide layout techniques that shorten the source/drain metal layers compared with the layout technique illustrated in FIGS. 1A to 1D. The shorten source/drain metal layers allow the active region of the transistor to be moved closer to the gate metal layer, which reduces the area of the transistor, as discussed further below.

Figure 2A:
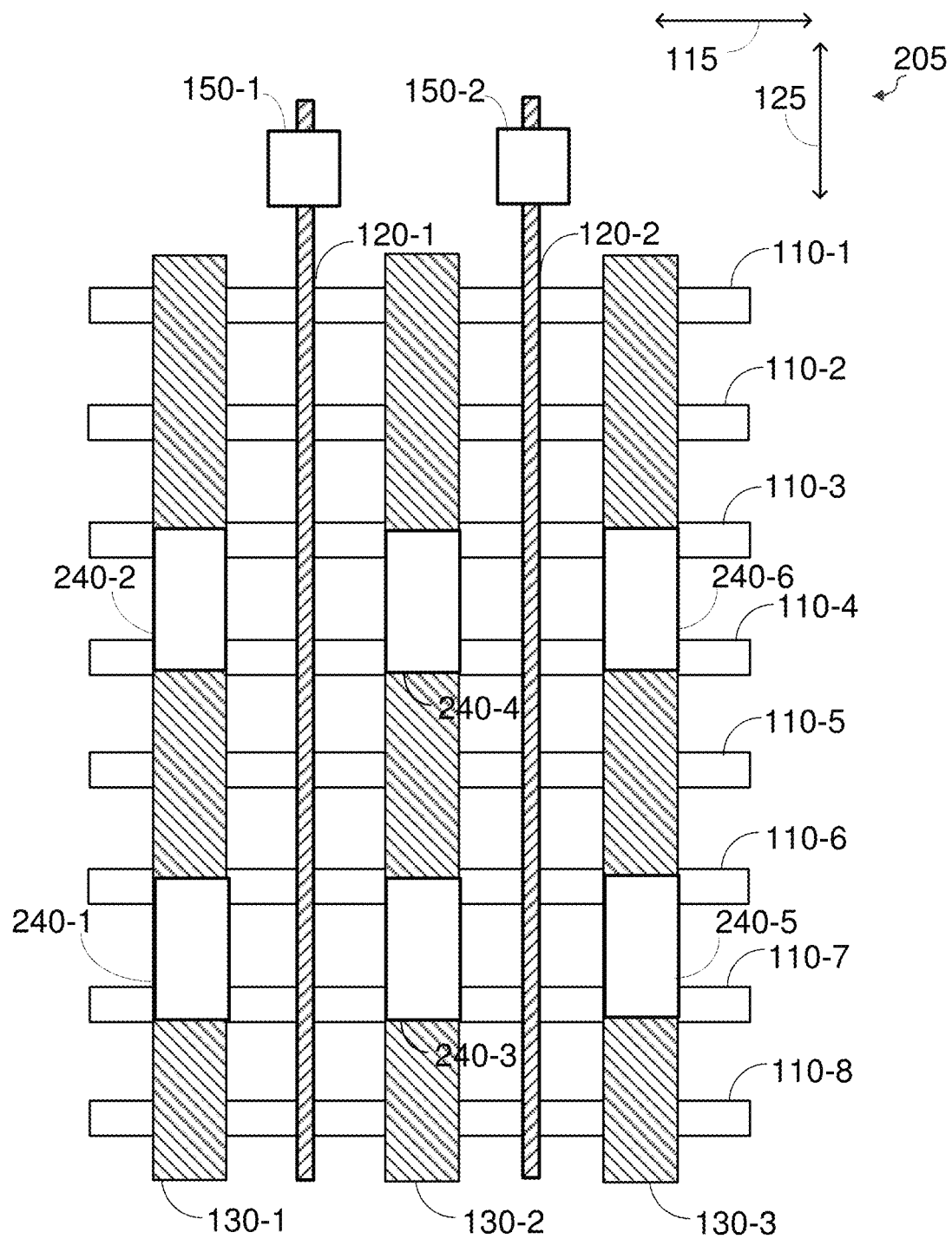
FIG. 2A shows an example of rectangular vias distributed on the source/drain contact layers in which the number of vias is reduced compared with the number of vias in FIG. 1C according to certain aspects of the present disclosure.
Figure 2B:
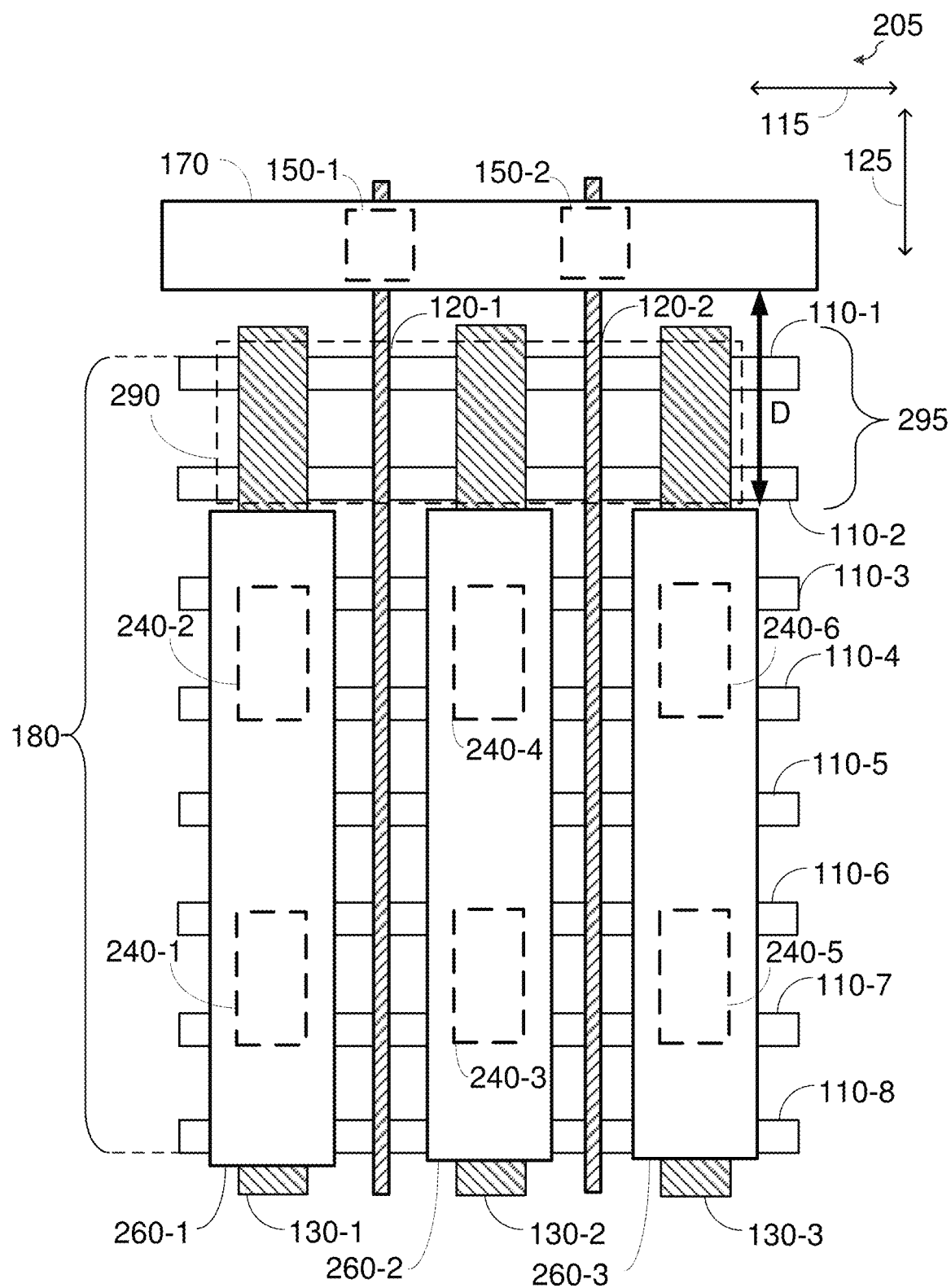
FIG. 2B shows an example of source/drain metal layers having shorter lengths than the source/drain metal layers in FIG. 1D according to certain aspects of the present disclosure.

FIGS. 2A and 2B show top views of an exemplary transistor 205 formed on the substrate of a semiconductor die according to certain aspects of the present disclosure. The transistor 205 includes the fins 110-1 to 110-8, the gates 120-1 and 120-2, the gate vias 150-1 and 150-2, the gate metal layer 170, and the source/drain contact layers 130-1, 130-2, and 130-3 discussed above with reference to FIGS. 1A and 1B. Since the fins 110-1 to 110-8, the gates 120-1 and 120-2, the gate vias 150-1 and 150-2, the gate metal layer 170, and the source/drain contact layers 130-1, 130-2, and 130-3 are described above, the description of these structures is not repeated here for brevity.

Referring to FIG. 2A, the transistor 205 also includes source/drain vias 240-1 to 240-6 formed on top of the source/drain contact layers 130-1, 130-2, and 130-3. In the example in FIG. 2A, each of the source/drain vias 240-1 to 240 has a rectangular (i.e., bar shaped) footprint instead of the square footprint of the source/drain vias 140-1 to 140-12 shown in FIG. 1C. The rectangular footprint allows the number of vias to be reduced (e.g., by a factor of two compared with FIG. 1C) while only incurring a small increase in parasitic resistance. This is because the rectangular footprint increases the area of each of the source/drain vias 240-1 to 240-6, which reduces the resistance of each of the source/drain vias. As used herein, a via has a "rectangle footprint" when a length of the via is longer than a width of the via. The width may be in the first direction 115 and the length may be in the second direction 125. In one example, the length of each of the source/drain vias 240-1 to 240-6 is at least 1.2 times longer than the width. In another example, the length of each of the source/drain vias 240-1 to 240-6 is at least 1.5 times longer than the width. Each of the source/drain vias 240-1 to 240-6 may include one conductive material or multiple conductive materials (e.g., in multiple layers where each of the layers includes a respective one of the conductive materials).

In certain aspects, the source/drain vias 240-1 to 240-6 do not overlap one or more of the fins 110-1 to 110-8 located closest to the gate metal layer 170 (shown in FIG. 2B). As discussed further below, this allows the lengths of the source/drain metal layers 260-1, 260-2, and 260-3 to be shortened. In the example shown in FIG. 2A, the source/drain vias 240-1 to 240-6 do not overlap the two fins 110-1 and 110-2 located closest to the gate metal layer 170 (shown in FIG. 2B). In this example, the source/drain contact layers 130-1, 130-2, and 130-3 (which extend over the fins 110-1 and 110-2) provide routing between the fins 110-1 and 110-2 and the source/drain vias 240-1 to 240-6 at the expense of a small increase in parasitic resistance compared with the case where source/drain vias are placed directly over the fins 110-1 and 110-2. The small increase in parasitic resistance due to the additional routing through the source/drain contact layers 130-1, 130-2, and 130-3 is mitigated by the rectangular footprint of each of the source/drain vias 240-1 to 240-6, which reduces the resistance of each of the source/drain vias 1240-1 to 240-6.

In the example in FIG. 2A, each of the source/drain vias 240-1, 240-3, and 240-5 overlaps a first pair of adjacent fins 110-6 and 110-7, and each of the source/drain vias 240-2, 240-4, and 240-6 overlaps a second pair of adjacent fins 110-3 and 110-4. Adjacent source/drain vias 240-1 and 240-2 on the first source/drain contact layer 130-1 are spaced apart such that the adjacent source/drain vias 240-1 and 240-2 do not overlap fin 110-5, which is located between the adjacent source/drain vias 240-1 and 240-2. This spacing helps ensure that the source/drain vias 240-1 and 240-2 are not concentrated in a small region of the first source/drain contact layer 130-1, which would increase routing for one or more of the fins and increase parasitic resistance. Adjacent source/drain vias 240-3 and 240-4 on the second source/drain contact layer 130-2 and adjacent source/drain vias 240-5 and 240-6 on the third source/drain contact layer 130-3 are similarly spaced apart, as shown in FIG. 2A.

Referring to FIG. 2B, the transistor 205 also includes a first source/drain metal layer 260-1, a second source/drain metal layer 260-2, a third source/drain metal layer 260-3, and a gate metal layer 170. Each of the source/drain metal layers 260-1, 260-2, and 260-3 and the gate metal layer 170 may be formed from a first metal layer, in which the first metal layer is patterned and etched during fabrication to form the source/drain metal layers 260-1, 260-2, and 260-3, and the gate metal layer 170 shown in FIG. 2D. In certain aspects, the first metal layer is the M1 layer discussed above.

The first source/drain metal layer 260-1 extends over a portion of the first source/drain contact layer 130-1 in the second direction 125, and overlaps fins 110-3 to 110-8. The source/drain vias 240-1 and 240-2 (shown in dashed lines) are disposed between the first source/drain contact layer 130-1 and the first source/drain metal layer 260-1, and electrically couple the first source/drain contact layer 130-1 to the first source/drain metal layer 260-1.

In this example, the first source/drain metal layer 260-1 is shortened compared with the first source/drain metal layer 160-1 in FIG. 1D, in which the first source/drain metal layer 260-1 does not extend over the fins 110-1 and 110-2. This is made possible by the fact that the source/drain vias 240-1 and 240-2 on the first source/drain contact layer 130-1 do not overlap the fins 110-1 and 110-2. As a result, the first source/drain metal layer 260-1 can be formed over the source/drain vias 240-1 and 240-2 without having to extend over the fins 110-1 and 110-2.

The second source/drain metal layer 260-2 extends over a portion of the second source/drain contact layer 130-2 in the second direction 125, and overlaps fins 110-3 to 110-8. The source/drain vias 240-3 and 240-4 (shown in dashed lines) are disposed between the second source/drain contact layer 130-2 and the second source/drain metal layer 260-2, and electrically couple the second source/drain contact layer 130-2 to the second source/drain metal layer 260-2.

In this example, the second source/drain metal layer 260-2 is shortened compared with the second source/drain metal layer 160-2 in FIG. 1D, in which the second source/drain metal layer 260-2 does not extend over the fins 110-1 and 110-2. This is made possible by the fact that the source/drain vias 240-3 and 240-4 on the second source/drain contact layer 130-2 do not overlap the fins 110-1 and 110-2. As a result, the second source/drain metal layer 260-2 can be formed over the source/drain vias 240-3 and 240-4 without having to extend over the fins 110-1 and 110-2.

The third source/drain metal layer 260-3 extends over a portion of the third source/drain contact layer 130-3 in the second direction 125, and overlaps fins 110-3 to 110-8. The source/drain vias 240-5 and 240-6 (shown in dashed lines) are disposed between the third source/drain contact layer 130-3 and the third source/drain metal layer 260-3, and electrically couple the third source/drain contact layer 130-3 to the third source/drain metal layer 260-3.

In this example, the third source/drain metal layer 260-3 is shortened compared with the third source/drain metal layer 160-3 in FIG. 1D, in which the third source/drain metal layer 260-3 does not extend over the fins 110-1 and 110-2. This is made possible by the fact that the source/drain vias 240-5 and 240-6 on the third source/drain contact layer 130-3 do not overlap the fins 110-1 and 110-2. As a result, the third source/drain metal layer 260-3 can be formed over the source/drain vias 240-5 and 240-6 without having to extend over the fins 110-1 and 110-2.

Thus, in this example, the lengths of the source/drain metal layers 260-1, 260-2, and 260-3 are shortened in which the source/drain metal layers 260-1, 260-2, and 260-3 do not overlap one or more fins (e.g., fins 110-1 and 110-2) in the active region 180 located closest to the gate metal layer 170. This allows the active region 180 to be moved closer to the gate metal layer 170 to reduce the area of the transistor 205 while maintaining the minimum spacing D between the gate metal layer 170 and the source/drain metal layers 260-1, 260-2, and 260-3. As shown in FIG. 2B, the region 290 between the gate metal layer 170 and the source/drain metal layers 260-1, 260-2, and 260-3 include two fins 110-1 and 110-2 in the active region 180. However, it is to be appreciated that the present disclosure is not limited to this example, and that the region 290 may include one or more of the fins 110-1 to 110-8. Also, as shown in FIG. 2B, a portion 295 of each of the source/drain contact layers 130-1, 130-2, and 130-3 extends pass an end of the respective one of the source/drain metal layers 260-1, 260-2, and 260-3 in the second direction 125 within the region 290. The portion 295 of each of the source/drain contact layers 130-1, 130-2, and 130-3 extends over one or more of the fins 110-1 to 110-8 (e.g., the fins 110-1 and 110-2).

Figure 2C:
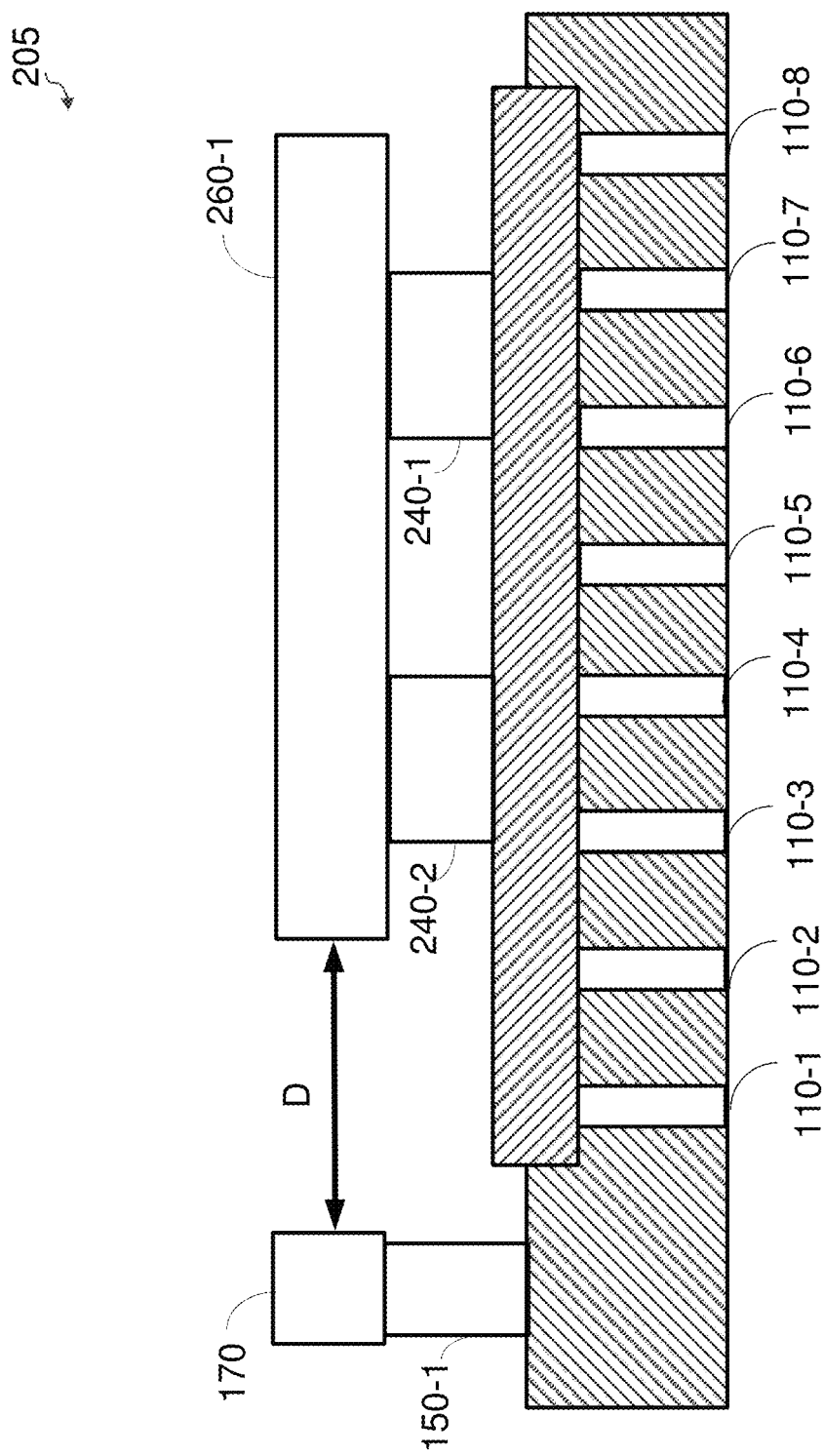
FIG. 2C shows a side view of the structure in FIG. 2B according to certain aspects of the present disclosure.

FIG. 2C shows a side view of the transistor 205. As shown in FIG. 2C, the first source/drain metal layer 260-1 does not extend extends over the fins 110-1 and 110-2. This allows the active region 180 to be moved closer to the gate metal layer 170 to reduce the area of the transistor 205 while maintaining the minimum spacing D between the first source/drain metal layer 260-1 and the gate metal layer 170.

As shown in FIG. 2C, the first gate 120-1 may wrap around three or more sides of each of the fins 110-1 to 110-8 (e.g., wrap around the top side and two opposite sidewalls of each of the fins 110-1 to 110-8). This increases the surface area between the first gate 120-1 and the fins 110-1 to 110-8, providing improved electrical control over the channel conductance of the transistor 205. The second gate 120-2 (not shown in FIG. 2C) may similarly wrap around the fins 110-1 to 110-8.

Although each of the fins 110-1 to 110-8 is shown as having a rectangular cross section (i.e., profile) in the example in FIG. 2C, it is to be understood that each of the fins 110-1 to 110-8 may have another cross-sectional shape. For example, each of the fins 110-1 to 110-8 may have a tapered cross section, in which the fin is thicker at the base than the top.

Figure 3:
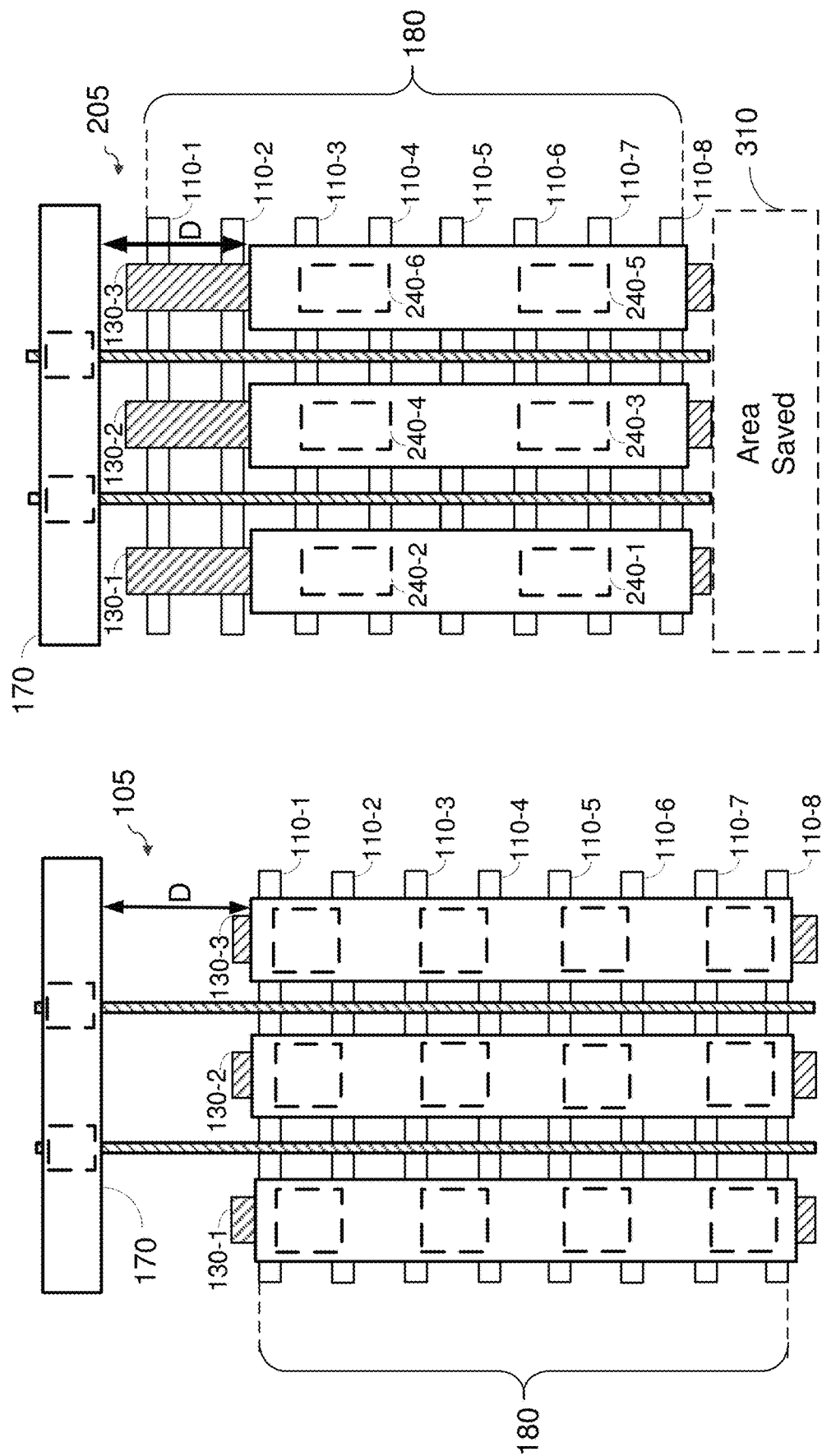
FIG. 3 shows a comparison of the structure shown in FIG. 1D with the structure shown in FIG. 2B according to certain aspects of the present disclosure.

FIG. 3 shows a side-by-side comparison of the transistor 205 and the transistor 105. As shown in FIG. 3, the active region 180 of the transistor 205 is moved closer to the gate metal layer 170 compared with the active region 180 of the transistor 105. Moving the active region 180 closer to the gate metal layer 170 reduces the area of the transistor 205 compared with the transistor 105, resulting in the area savings 310 shown in FIG. 3.

The layout of the transistor 205 increases parasitic resistance compared with the layout of the transistor 105 due to the additional routing through the source/drain contact layers 130-1, 130-2, and 130-3 for the fins 110-1 and 110-2. However, the increase in the parasitic resistance is mitigated by the rectangular footprint of each of the source/drain vias 240-1 to 240-6, resulting in a small increase in the parasitic resistance, which is offset by the substantial reduction in area.

Figure 4:
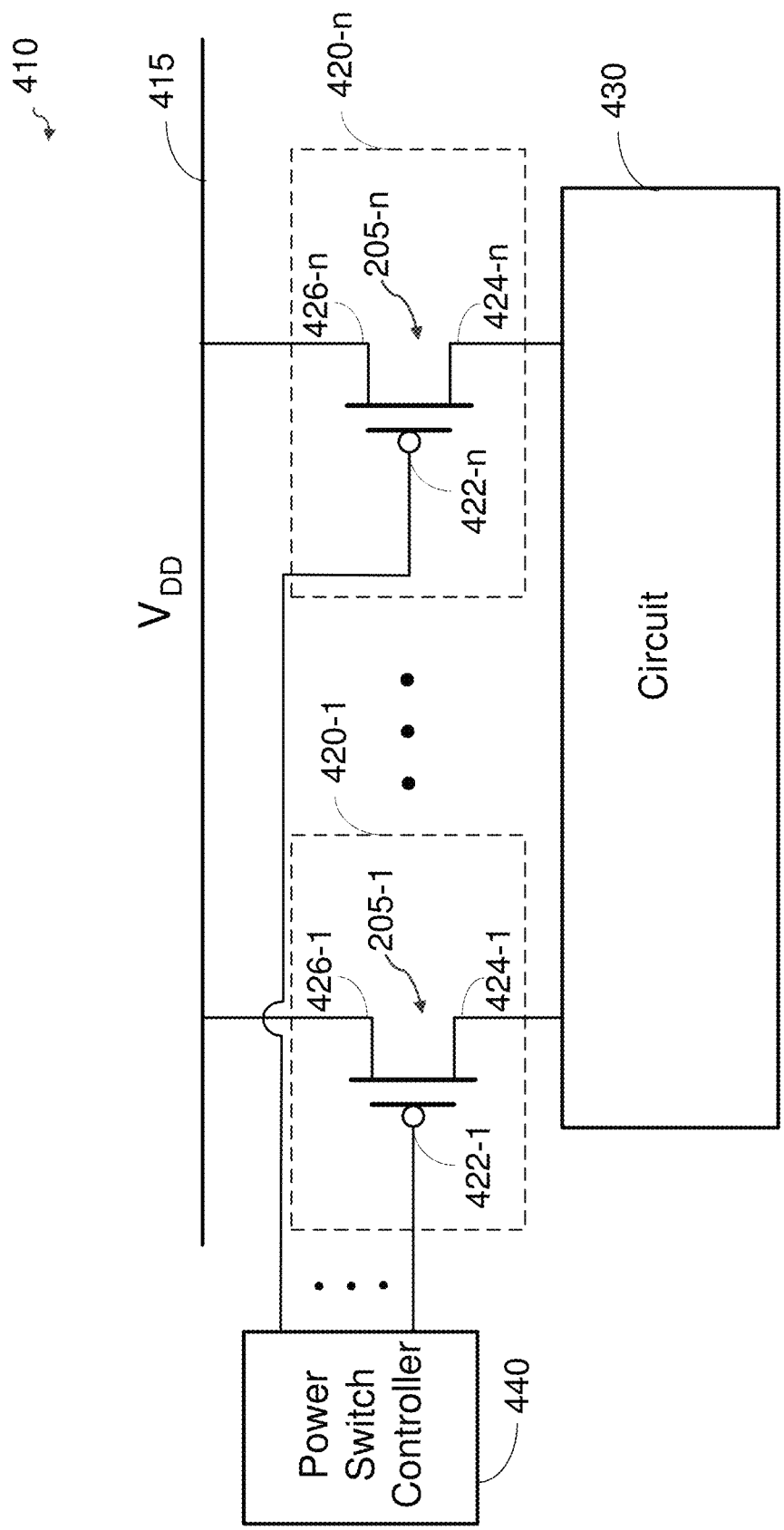
FIG. 4 shows an example of power switches implemented with transistors according to certain aspects of the present disclosure.

The transistor 205 may be used as a power switch in certain aspects. In this regard, FIG. 4 shows an example of an integrated system 410 including power switches 420-1 to 420-$n$, a power distribution network 415, a circuit 430, and a power switch controller 440. The power distribution network 415 provides a supply voltage $V_{DD}$ (e.g., from a power management integrated circuit (PMIC)). The power switches 420-1 to 420-$n$ are coupled between the power distribution network 415 and the circuit 430 to control power to the circuit 430. The circuit 430 may include at least one of a processor, a memory, a modem, sequential logic, and/or another type of circuit.

The power switch controller 440 is coupled to the power switches 420-1 and 420-$n$, and is configured to control the on/off states of the power switches 420-1 to 420-$n$. For example, the power switch controller 440 may turn off the power switches 420-1 to 420-$n$ when the circuit 430 is not active (e.g., in an inactive mode) to conserve power, and turn on the power switches 420-1 to 420-$n$ when the circuit 430 is active (e.g., in an active mode). When the circuit 430 is powered up from an inactive state to an active state, the power switch controller 440 may also time the turn on of each power switch 420-1 to 420-$n$ based on a power-up timing sequence.

As shown in FIG. 4, the power switches 420-1 to 420-$n$ may be implemented with respective transistors 205-1 to 205-$n$ where each of the transistors 205-1 to 205-$n$ is a separate instance of the transistor 205. In this example, each of the power switches 420-1 to 420-$n$ has a respective gate terminal 422-1 to 422-$n$ coupled to the gate metal layer 170 of the respective transistor 205-1 to 205-$n$. The gate terminal 422-1 to 422-$n$ of each of the power switches 420-1 to 420-$n$ is coupled to the power switch controller 440. In this example, the power switch controller 440 controls the on/off state of each of the power switches 420-1 to 420-$n$ by controlling the voltage applied to the respective gate terminal 422-1 to 422-$n$. Each of the power switches 420-1 to 420-$n$ also has a respective first source/drain terminal 424-1 to 424-$n$ coupled to the circuit 430, and a respective second source/drain terminal 426-1 to 426-$n$ coupled to the power distribution network 415. The first source/drain terminal 424-1 to 424-$n$ of each of the power switches 420-1 to 420-$n$ may be coupled to the respective first source/drain metal layer 260-1 and third source/drain metal layer 260-3, and the second source/drain terminal 426-1 to 426-$n$ of each of the power switches 420-1 to 420-$n$ may be coupled to the respective second source/drain metal layer 260-2. Alternatively, the first source/drain terminal 424-1 to 424-$n$ of each of the power switches 420-1 to 420-$n$ may be coupled to the respective second source/drain metal layer 260-1, and the second source/drain terminal 426-1 to 426-$n$ of each of the power switches 420-1 to 420-$n$ may be coupled to the respective first source/drain metal layer 260-1 and third source/drain metal layer 260-3.

In this example, the reduced area of each of the transistors 205-1 to 205-$n$ reduces the area of the power switches 420-1 to 420-$n$. In certain aspects, the number of power switches 420-1 to 420-$n$ may be in the hundreds or thousands. Thus, by reducing the area the power switches 420-1 to 420-$n$, the area of the die used for power control can be significantly reduced, increasing the area of the die available for the circuit 430.

It is to be appreciated that the transistor 205 is not limited to a power switch and may be used in other types of devices.

Implementation examples are described in the following numbered clauses:

1. A die, comprising:
   fins extending in a first direction;
   a gate formed over the fins, the gate extending in a second direction that is perpendicular to the first direction;
   a first source/drain contact layer formed over the fins and extending in the second direction;
   a second source/drain contact layer formed over the fins and extending in the second direction, wherein the first source/drain contact layer and the second source/drain contact layer are on opposite sides of the gate;
   a first source/drain metal layer electrically coupled to the first source/drain contact layer; and
   a second source/drain metal layer electrically coupled to the second source/drain contact layer, wherein the first source/drain metal layer and the second source/drain metal layer do not overlap one or more of the fins.

2. The die of clause 1, further comprising a gate metal layer electrically coupled to the gate, wherein the one or more of the fins are located within a region between the gate metal layer and each of the first source/drain metal layer and the second source/drain metal layer.

3. The die of clause 2, wherein:
   the gate metal layer extends in the first direction; and
   each of the first source/drain metal layer and the second source/drain metal layer extends in the second direction.

4. The die of clause 2 or 3, wherein the gate metal layer, the first source/drain metal layer, and the second source/drain metal layer are formed from a first metal layer.

5. The die of any one of clauses 1 to 4, further comprising:
   first vias disposed between the first source/drain contact layer and the first source/drain metal layer; and
   second vias disposed between the second source/drain contact layer and the second source/drain metal layer.

6. The die of clause 5, wherein each of the first vias and each of the second vias has a rectangular footprint.

7. The die of clause 6, wherein the rectangular footprint of each of the first vias and each of the second vias has a length and a width wherein the length is at least 1.2 longer than the width.

8. The die of clause 6, wherein the rectangular footprint of each of the first vias and each of the second vias has a length and a width wherein the length is at least 1.5 longer than the width.

9. The die of any one of clauses 5 to 8, wherein the first vias and the second vias do not overlap the one or more of the fins.

10. The die of any one of clauses 5 to 9, wherein one of the first vias overlaps at least two of the fins.

11. The die of any one of clauses 5 to 10, wherein each of the first vias overlaps a respective pair of the fins.
12. The die of any one of clauses 5 to 11, wherein adjacent ones of the first vias do not overlap one of the fins between the adjacent ones of the first vias.
13. A system, comprising:
a switch comprising:
fins extending in a first direction;
a gate formed over the fins, the gate extending in a second direction that is perpendicular to the first direction;
a first source/drain contact layer formed over the fins and extending in the second direction;
a second source/drain contact layer formed over the fins and extending in the second direction, wherein the first source/drain contact layer and the second source/drain contact layer are on opposite sides of the gate;
a first source/drain metal layer electrically coupled to the first source/drain contact layer;
a second source/drain metal layer electrically coupled to the second source/drain contact layer, wherein the first source/drain metal layer and the second source/drain metal layer do not overlap one or more of the fins; and
a gate metal layer electrically coupled to the gate; and
a power switch controller coupled to the gate metal layer;
a power distribution network coupled to a first one of the first source/drain metal layer and the second source/drain metal layer; and
a circuit coupled to a second one of the first source/drain metal layer and the second source/drain metal layer.
14. The system of clause 13, wherein the power switch controller is configured to turn on the switch when the circuit is in an active mode, and turn off the switch when the circuit is in an inactive mode.
15. The system of clause 13 or 14, wherein the circuit includes at least one of sequential logic, a processor, a modem, and a memory.
16. The system of any one of clauses 13 to 15, wherein the switch is integrated on a die.
17. The system of any one of clauses 13 to 16, wherein the one or more of the fins are located within a region between the gate metal layer and each of the first source/drain metal layer and the second source/drain metal layer.
18. The system of clause 17, wherein:
the gate metal layer extends in the first direction; and
each of the first source/drain metal layer and the second source/drain metal layer extends in the second direction.
19. The system of any one of clauses 13 to 18, wherein the gate metal layer, the first source/drain metal layer, and the second source/drain metal layer are formed from a first metal layer.
20. The system of any one of clauses 13 to 19, further comprising:
first vias disposed between the first source/drain contact layer and the first source/drain metal layer; and
second vias disposed between the second source/drain contact layer and the second source/drain metal layer.
21. The system of clause 20, wherein each of the first vias and each of the second vias has a rectangular footprint.
22. The system of clause 21, wherein the rectangular footprint of each of the first vias and each of the second vias has a length and a width wherein the length is at least 1.2 longer than the width.
23. The system of clause 21, wherein the rectangular footprint of each of the first vias and each of the second vias has a length and a width wherein the length is at least 1.5 longer than the width.
24. The system of any one of clauses 20 to 23, wherein the first vias and the second vias do not overlap the one or more of the fins.
25. The system of any one of clauses 20 to 24, wherein one of the first vias overlaps at least two of the fins.
26. The system of any one of clauses 20 to 25, wherein each of the first vias overlaps a respective pair of the fins.
27. The system of any one of clauses 20 to 26, wherein adjacent ones of the first vias do not overlap one of the fins between the adjacent ones of the first vias.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property. The term "coupled" or "coupling" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A die, comprising:
fins extending in a first direction;
a gate formed over the fins, the gate extending in a second direction that is perpendicular to the first direction;
a first source/drain contact layer formed over the fins and extending in the second direction;
a second source/drain contact layer formed over the fins and extending in the second direction, wherein the first source/drain contact layer and the second source/drain contact layer are on opposite sides of the gate;
a first source/drain metal layer electrically coupled to the first source/drain contact layer; and
a second source/drain metal layer electrically coupled to the second source/drain contact layer, wherein the first source/drain metal layer and the second source/drain metal layer do not overlap one or more of the fins.
2. The die of claim 1, further comprising a gate metal layer electrically coupled to the gate, wherein the one or more of the fins are located within a region between the gate metal layer and each of the first source/drain metal layer and the second source/drain metal layer.

3. The die of claim 2, wherein:
the gate metal layer extends in the first direction; and
each of the first source/drain metal layer and the second source/drain metal layer extends in the second direction.

4. The die of claim 2, wherein the gate metal layer, the first source/drain metal layer, and the second source/drain metal layer are formed from a first metal layer.

5. The die of claim 1, further comprising:
first vias disposed between the first source/drain contact layer and the first source/drain metal layer; and
second vias disposed between the second source/drain contact layer and the second source/drain metal layer.

6. The die of claim 5, wherein each of the first vias and each of the second vias has a rectangular footprint.

7. The die of claim 6, wherein the rectangular footprint of each of the first vias and each of the second vias has a length and a width wherein the length is at least 1.2 times longer than the width.

8. The die of claim 6, wherein the rectangular footprint of each of the first vias and each of the second vias has a length and a width wherein the length is at least 1.5 times longer than the width.

9. The die of claim 5, wherein the first vias and the second vias do not overlap the one or more of the fins.

10. The die of claim 5, wherein one of the first vias overlaps at least two of the fins.

11. The die of claim 5, wherein each of the first vias overlaps a respective pair of the fins.

12. The die of claim 5, wherein adjacent ones of the first vias do not overlap one of the fins between the adjacent ones of the first vias.

13. A system, comprising:
a switch comprising:
fins extending in a first direction;
a gate formed over the fins, the gate extending in a second direction that is perpendicular to the first direction;
a first source/drain contact layer formed over the fins and extending in the second direction;
a second source/drain contact layer formed over the fins and extending in the second direction, wherein the first source/drain contact layer and the second source/drain contact layer are on opposite sides of the gate;
a first source/drain metal layer electrically coupled to the first source/drain contact layer;
a second source/drain metal layer electrically coupled to the second source/drain contact layer, wherein the first source/drain metal layer and the second source/drain metal layer do not overlap one or more of the fins; and
a gate metal layer electrically coupled to the gate; and
a power switch controller coupled to the gate metal layer;
a power distribution network coupled to a first one of the first source/drain metal layer and the second source/drain metal layer; and
a circuit coupled to a second one of the first source/drain metal layer and the second source/drain metal layer.

14. The system of claim 13, wherein the power switch controller is configured to turn on the switch when the circuit is in an active mode, and turn off the switch when the circuit is in an inactive mode.

15. The system of claim 13, wherein the circuit includes at least one of sequential logic, a processor, a modem, and a memory.

16. The system of claim 13, wherein the switch is integrated on a die.

17. The system of claim 13, wherein the one or more of the fins are located within a region between the gate metal layer and each of the first source/drain metal layer and the second source/drain metal layer.

18. The system of claim 17, wherein:
the gate metal layer extends in the first direction; and
each of the first source/drain metal layer and the second source/drain metal layer extends in the second direction.

19. The system of claim 13, wherein the gate metal layer, the first source/drain metal layer, and the second source/drain metal layer are formed from a first metal layer.

20. The system of claim 13, further comprising:
first vias disposed between the first source/drain contact layer and the first source/drain metal layer; and
second vias disposed between the second source/drain contact layer and the second source/drain metal layer.

21. The system of claim 20, wherein each of the first vias and each of the second vias has a rectangular footprint.

22. The system of claim 21, wherein the rectangular footprint of each of the first vias and each of the second vias has a length and a width wherein the length is at least 1.2 times longer than the width.

23. The system of claim 21, wherein the rectangular footprint of each of the first vias and each of the second vias has a length and a width wherein the length is at least 1.5 times longer than the width.

24. The system of claim 20, wherein the first vias and the second vias do not overlap the one or more of the fins.

25. The system of claim 20, wherein one of the first vias overlaps at least two of the fins.

26. The system of claim 20, wherein each of the first vias overlaps a respective pair of the fins.

27. The system of claim 20, wherein adjacent ones of the first vias do not overlap one of the fins between the adjacent ones of the first vias.

* * * * *